United States Patent [19]

Nepveu

[11] Patent Number: 5,512,823
[45] Date of Patent: Apr. 30, 1996

[54] ELECTROMAGNETIC FIELD DETECTOR FOR DETECTING ELECTROMAGNETIC FIELD STRENGTH IN AN EXTREMELY LOW FREQUENCY BAND AND A VERY LOW FREQUENCY BAND

[75] Inventor: Raymond Nepveu, Londonderry, N.H.

[73] Assignee: Eakes Research, Inc., Merrimack, N.H.

[21] Appl. No.: 167,512

[22] Filed: Dec. 15, 1993

[51] Int. Cl.⁶ .................... G01R 33/02; G01R 29/08; G01R 13/00
[52] U.S. Cl. .................... 324/258; 324/128; 324/115; 324/72; 324/260; 340/600
[58] Field of Search .................... 324/67, 72, 115, 324/126–128, 133, 244, 258, 260, 326, 345; 340/547, 600; 455/226.2, 226.4; 128/653.1

[56] References Cited

U.S. PATENT DOCUMENTS

| | | | |
|---|---|---|---|
| 2,879,382 | 3/1959 | Freen | 324/115 X |
| 4,198,596 | 4/1980 | Waeselynck et al. | 324/335 X |
| 4,634,969 | 1/1987 | Edlin et al. | 324/258 X |
| 4,954,812 | 9/1990 | Lebron | 324/260 X |
| 5,150,051 | 9/1992 | Friedman et al. | 324/258 |
| 5,256,960 | 10/1993 | Novini | 324/258 |
| 5,309,097 | 5/1994 | Bill et al. | 324/258 |
| 5,311,130 | 5/1994 | Bill et al. | 324/258 |

OTHER PUBLICATIONS

"Electromagnetic Field Radiation Monitors", Walker Scientific Inc., Publication (date unknown).
"Build this Field Meter", Reinhard Metz, Radio–Electronics, pp. 33–38, Apr. 1991 (Publication).
GB 02244560, UK Patent Application, Dec. 1991 by Michael Anthony Butler.
User's Handbook for Evaluating Visual Display Units, published by MPR 1990: 10, Dec. 31, 1990.
Test Methods for Visual Display Units, MPR, 1990: 8 section 2.03, Dec. 1, 1990.

*Primary Examiner*—Sandra L. O'Shea
*Assistant Examiner*—Jay M. Patidar
*Attorney, Agent, or Firm*—Cesari and McKenna

[57] ABSTRACT

A hand-held detector for determining whether the exposure to electromagnetic fields resulting from electric power lines, faulty wiring, and electrical and electronic appliances is within acceptable limits. The device includes a shielded pickup coil, a filter circuit having a transfer function which provides a distinct response in two frequency bands, a summing circuit which provides a voltage indicative of the detected levels of electromagnetic flux density in the two frequency bands, and a display circuit, to provide a visual indication of the detected energy level. The filtering circuit preferably includes a first, extremely low frequency (ELF) amplifier having an upper cutoff frequency of approximately 2 kHz, and a second, very low frequency (VLF) amplifier having a lower cutoff at approximately 6 kHz. The display circuit consists of a series of visual indicators, such as light emitting diodes (LEDs), which progress from green to yellow to red in color, in the manner of a traffic signal, to indicate whether the received radiation in both frequency bands is below, at, or above an acceptable level.

20 Claims, 5 Drawing Sheets

1

ELECTROMAGNETIC FIELD DETECTOR FOR DETECTING ELECTROMAGNETIC FIELD STRENGTH IN AN EXTREMELY LOW FREQUENCY BAND AND A VERY LOW FREQUENCY BAND

FIELD OF THE INVENTION

This invention relates generally to the measurement of low frequency electromagnetic radiation, and in particular to an easy-to-use detector which determines whether harmful flux density levels exist in two frequency bands of interest.

BACKGROUND OF THE INVENTION

The public has increasingly been concerned about possible health hazards due to low frequency radiation emanating from electrical and electronic devices, as well as the associated electrical power lines and distribution equipment. One concern has been focused on the effects of long-term exposure to magnetic fields generated by high powered, alternating current (AC) transmission lines, and whether or not they can cause cancer. This concern has resulted in certain studies of the problem, such as the case-controlled study undertaken by the Karolinska Institute, in Stockholm, Sweden, between 1960 and 1985. That study found some correlation between childhood leukemia and adult myeliod leukemia and magnetic flux densities exceeding the 200–300 nanotesla range especially in individuals living within 300 meters of high voltage powerlines. See, for example, Ahlbomn Feychting, "Magnetic Fields and Cancer in People Residing Near Swedish High Voltage Power Lines," Karolinska Institute, IMM-Rapport, June 1992.

Another concern relates to the emissions of the electrical and electronic devices themselves, and particularly devices which generate electromagnetic energy at frequencies higher than the AC power lines, such as the cathode ray tubes (CRTs) used in television sets and the visual display units (VDUs) associated with computers. Among the symptoms thought to be related to prolonged exposure to the radiation generated by such devices are increased risk of miscarriage among pregnant women, and allergic reactions to the skin and eye, although conclusive scientific proof associating such symptoms with prolonged exposure to CRTs is lacking.

Due to this increased anxiety among the public at large, a number of governments and other institutions have begun to establish systems for nonmandatory testing of CRTs and other equipment.

For example, the Swedish government has established its "Alternating Electromagnetic Field Exposure Guidelines", MPR 1990:8. The electromagnetic emission characteristics established by these nonmandatory guidelines fall into two frequency bands of interest. A first, extremely low frequency (ELF) band extends from approximately five hertz to two kilohertz (kHz), and is primarily concerned with fields generated at the frequency of electric power lines. The suggested limit for acceptable magnetic field flux densities is 250 nanoteslas root mean square (rms) in the ELF band.

A second, very low frequency (VLF) band, ranges from approximately two kHz to 400 kHz, and flux densities greater than 25 nanoteslas (rms) are considered to exceed the guidelines. Electromagnetic energy in the VLF band is primarily generated by the vertical and horizontal retrace circuits in electronic devices, principally CRTs.

In practice, we have found that a number of appliances and electronic devices in common use in the home as well as in the office may generate enough electromagnetic energy to result in exposure to flux densities greater than that specified by the Swedish government guidelines. This is especially true for devices which are meant to be held in close proximity to the body during their use, such as electric razors, hair dryers, curling irons and the like.

Ungrounded or otherwise faulty electrical wiring systems may cause unbalanced return currents that also generate potentially harmful electric fields. In fact, instances have been observed in which an improperly grounded home wiring system generates ELF fields in excess of 250 nanoteslas in the home next door, even when the adjacent home itself has a properly grounded electrical system.

Traditionally, ELF and VLF radiation has been measured with precision scientific instruments such as laboratory gausmeters. These instruments are not particularly appropriate for a non-technically trained person to assess possibly dangerous exposure levels, however, for several reasons. First, such devices are typically expensive, and require at least some rudimentary training in electromagnetic field theory in order to use them properly. Secondly, a layperson typically cannot readily determine which exposure levels are acceptable, since absolute flux density measurements must be related in some manner to each of the frequency bands in which the radiation is observed.

Certain characteristics of the radiation of interest further complicate such measurements. Electromagnetic radiation in the ELF and VLF bands tends to be highly directional, may often vary greatly in magnitude over small distances, and may comprise magnetic fields having peak intensities are several orders of magnitude below that of the fields generated by the earth itself. Together, these and other considerations conspire to deprive the average individual of the ability to determine whether or not his or her own long-term exposure to electromagnetic radiation is an acceptable health risk.

What is needed is a user-friendly device enabling an average individual to easily determine whether the exposure to electromagnetic radiation in a particular situation is acceptable. The device would measure the exposure to electromagnetic flux densities in both an ELF band, centered around the common 60 hz alternating current (AC) power frequency, as well as the exposure to electromagnetic flux densities in a higher frequency VLF band, associated with emissions from electrical and electronic equipment such as VDTs, television sets, electric razors, hair dryers and the like.

The device should not require the user to determine field strength measurements in absolute numbers, but rather should provide a simple visual indication to indicate whether the exposure is well below acceptable radiation threshold levels, approaching the acceptable levels, or above the acceptable levels.

The visual indication should also automatically summarize detected variations in each of the frequency bands of interest, thereby further simplifying use of the device.

SUMMARY OF THE INVENTION

Briefly, the invention is a hand-held unit including a shielded pickup coil which produces a coil voltage in response to varying electromagnetic fields, a filter circuit connected to receive the coil voltage at its input, the filter circuit having a transfer function which provides a distinct response in two frequency bands, a summing circuit which provides a voltage indicative of the detected levels of electromagnetic flux density in the two frequency bands, and a display circuit, responsive to the output of the summing circuit, which provides a visual indication of the detected energy level.

The filtering function is preferably provided by a pair of bandpass amplifiers. The desired response in a first frequency band is provided by an extremely low frequency (ELF) bandpass amplifier having a lower half-power, or 3 decibel (db), cutoff frequency at about 12 hz, a peak response at approximately 100 hz, and an upper cutoff frequency of approximately 2 kHz. The desired response in a second band is provided by a very low frequency (VLF) amplifier, having a lower cutoff at approximately 6 kHz and an upper cutoff at approximately 100 kHz.

The amplifier outputs are coupled to detector diodes to provide a pair of voltages indicative of the received power level in the two frequency bands. The detected voltages are then summed by a summing amplifier.

The display circuit typically consists of a series of visual indicators, such as light emitting diodes (LEDs), which preferably progress from green to yellow to red in color, in the manner of a traffic signal, to indicate whether the presently received radiation is below the acceptable threshold levels, approaching the acceptable threshold levels, or above the acceptable threshold levels.

For example, if either the ELF or VLF guidelines are exceeded, the red LED is activated. If the measured fields are within eight decibels (db) below the threshold level, the yellow LED is activated. Below the minus eight db level, a green LED is activated, to indicate that the exposure is within the guidelines.

A slide-type potentiometer may be included to adjust the detection thresholds, thereby giving some indication of the magnitude of the field strength to the user.

There are several advantages to this invention. First, it may easily be used by a lay person to determine whether the exposure to electromagnetic flux in both ELF and VLF bands is acceptable. The device is thus of great utility in detecting the presence of high electromagnetic fields resulting from exposure to power lines, faulty home wiring, or noisy appliances and other devices.

The simple three-colored light display provides an easy to interpret presentation of the field detection results so that the user need only watch the progression of the colored signals to determine if the proximity to radiation is acceptable.

The unit provides a dual-band detector transfer function across the entire frequency spectrum of interest, from 12 hz to 100 kHz, and thus no switching between bands is necessary.

The circuits are simple to implement and can be embodied in an inexpensive device.

Because the outputs of the filter amplifiers are summed, even if the energy present in each of the ELF and VLF bands is below the threshold, when the weighted sum of the field strengths in both bands exceeds the threshold, the display will indicate that the safety guidelines have been exceeded.

The three LEDs are also energized in an overlapping fashion, which has the effect of enabling the user to interpolate the seriousness of the situation to some extent. For example, if the field exposure is approximately at the threshold level, both the yellow and red LEDs are enabled. Similarly, if the currently detected level is at approximately 8 db below threshold, both the yellow and the green LED are enabled.

BRIEF DESCRIPTION OF THE DRAWINGS

These and further features and advantages of the present invention are described below by reference to the accompanying drawings, in which.

DESCRIPTION OF AN ILLUSTRATIVE EMBODIMENT

Figure 1:
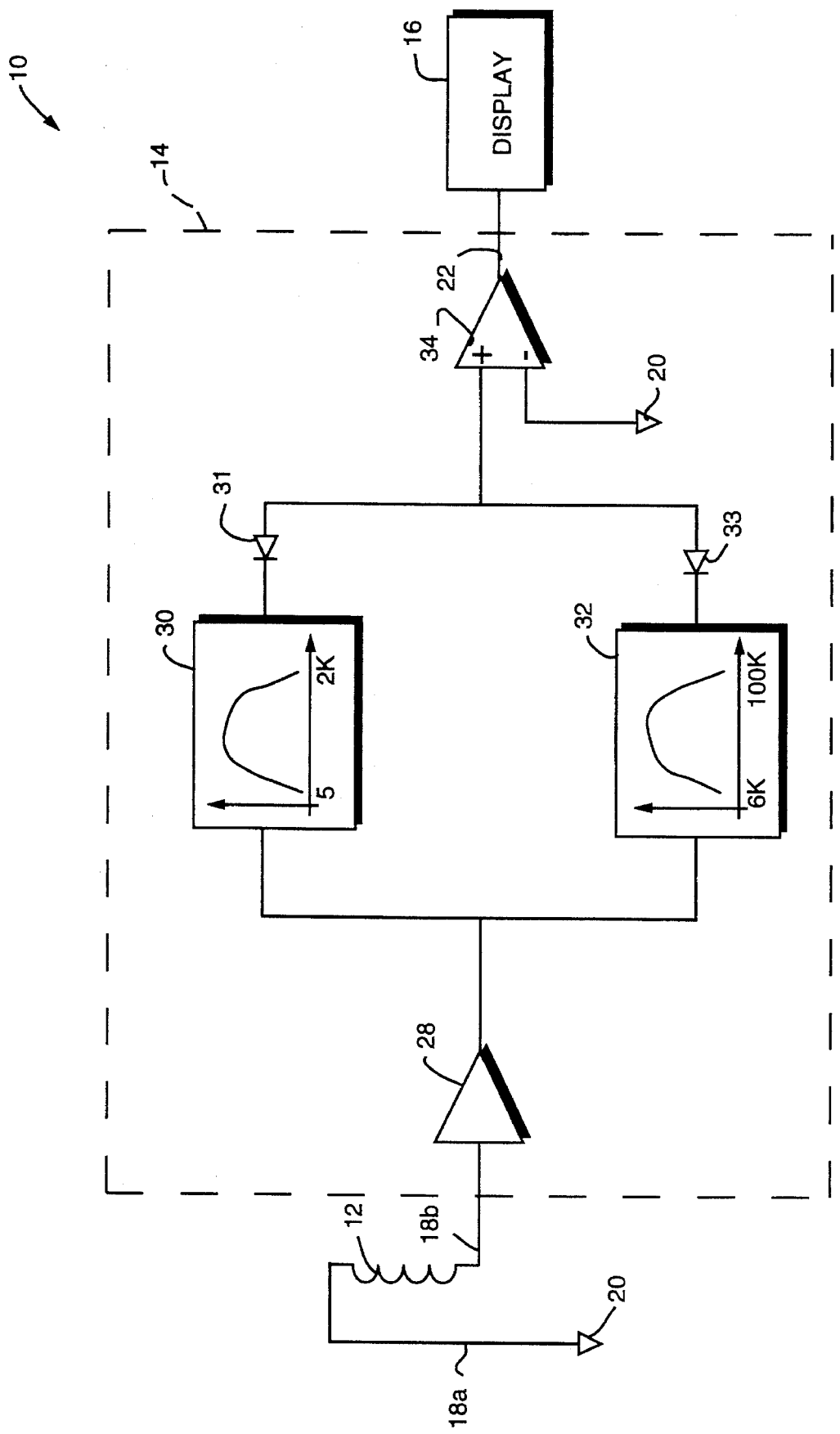
FIG. 1 is a block diagram of the circuitry of a meter which embodies the teaching of the present invention.

FIG. 1 shows a meter 10 including a rectangularly wound coil 12, a filter detector circuit 14 having a dual-band frequency response, and a display 16.

Ambient electromagnetic energy is first detected by the coil 12, which includes a first lead 18a and a second lead 18b, with the first lead 18a connected to a ground reference 20, and the second lead 18b providing a coil voltage signal to the filter/detector 14. In a manner which is well known in the art, ambient electromagnetic field fluctuations produce a voltage difference across the coil 12, producing a coil voltage at the second lead 18b which is proportional to the strength of any ambient electromagnetic field in the vicinity of the coil 12.

The coil voltage signal is in turn processed by the filter/ detector 14, to determine if the instantaneous strength of the electromotive field exceeds a predetermined threshold level in two frequency bands of interest. The result of this determination is provided as a detector output signal 22 to the display 16. The display 16 then presents a visual summary of the electromagnetic flux density levels in the two frequency bands of interest to the user.

Figure 2:
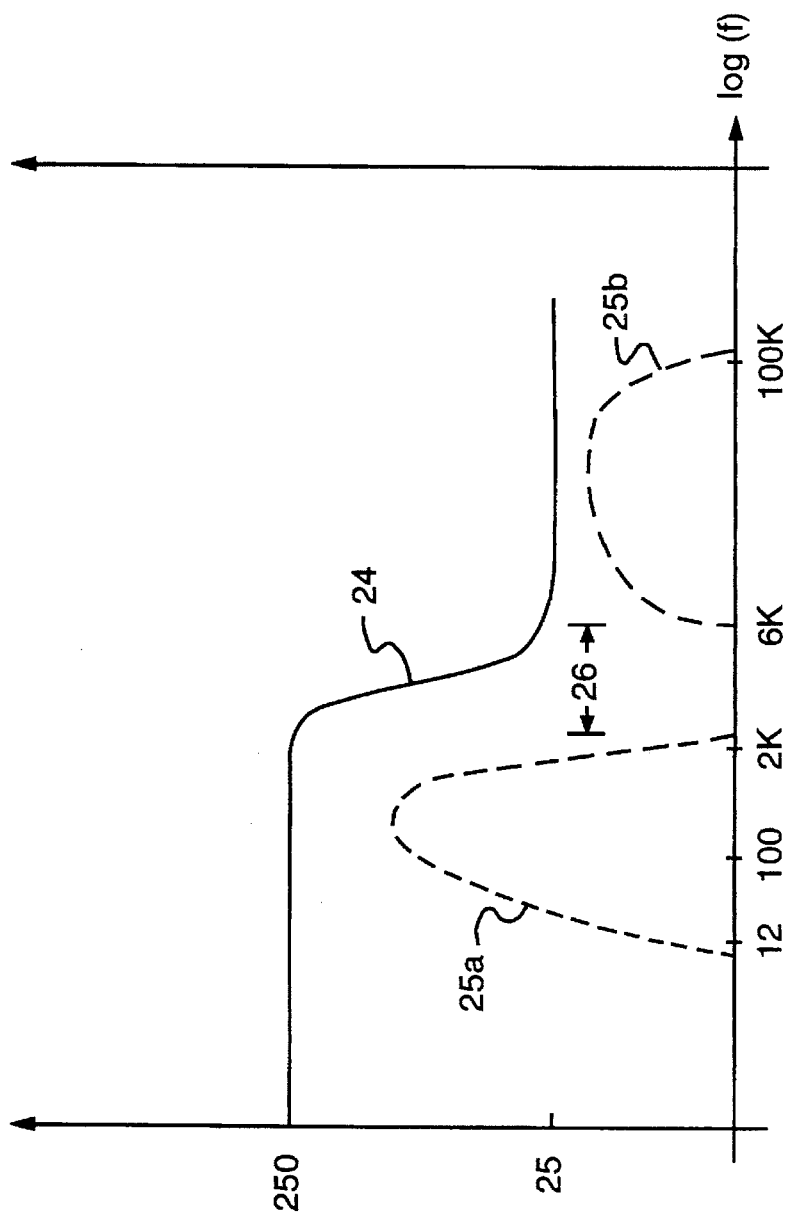
FIG. 2 is a plot of the frequency response of the unit showing the individual responses of a lower band amplifier and a higher band amplifier, as well as the response of a summing amplifier to their detected outputs.

Now referring briefly to FIG. 2, the desired response of the filter/detector 14 will be discussed more particularly. The axes in FIG. 2 represent incident magnetic flux density in nanoteslas root mean square (rms) versus logarithmic frequency, f.

As indicated by the threshold curve 24, the filter/detector 14 provides an indication that the field strength is unacceptable when the measured magnetic flux density exceeds 250 nanoteslas in a frequency range below approximately 2 kHz (kilohertz), and when it exceeds 25 nanoteslas for frequencies above approximately 6 kHz.

The desired response can thus be obtained by combining a first bandpass filter having a frequency response 25a which peaks somewhere in the frequency range below 2 kHz, and a second bandpass filter having a frequency response 25b with a passband above 6 kHz as band response 25b, together with appropriate gain adjustment circuitry. The illustrated first filter response 25a, for example, has a half-power, or 3 decibel (dB) lower cutoff at 12 Hz, a peak response at approximately 100 Hz, and an upper 3 dB cutoff at 2 KHz. The second filter response 25b has a lower cutoff at 6 kHz and upper cutoff at 100 KkHz. In this instance, the response in the range between 2 kHz and 6 kHz can thus be used as a so-called cross-over or transition region 26.

Returning back now to FIG. 1, in the preferred embodiment, the filter/detection circuit 14 is thus provided by a pair of filter sections 30 and 32. A first filter section 30 provides a desired Extremely Low Frequency (ELF) response (FIG.

2) in the range from approximately 12 hertz to 2 kHz. The second filter section 32 functions as a Very Low Frequency (VLF) band filter, providing the desired response 25b (FIG. 2) in the range from approximately 6 kHz to 100 kHz.

A first detector 31 connected to the ELF filter 30 provides a signal indicative of the energy level in the ELF frequency band. A second detector 33 connected to the VLF filter 32 performs the analogous function in the VLF band.

A summing amplifier 34 combines the responses of the first filter 30 and second filter 32 to provide the desired combined response shown in FIG. 2.

A preamplifier 28 is preferably also used between the coil 12 and the filters 30 and 32 to equalize the frequency-sensitivity of the coil 12.

Figure 3:
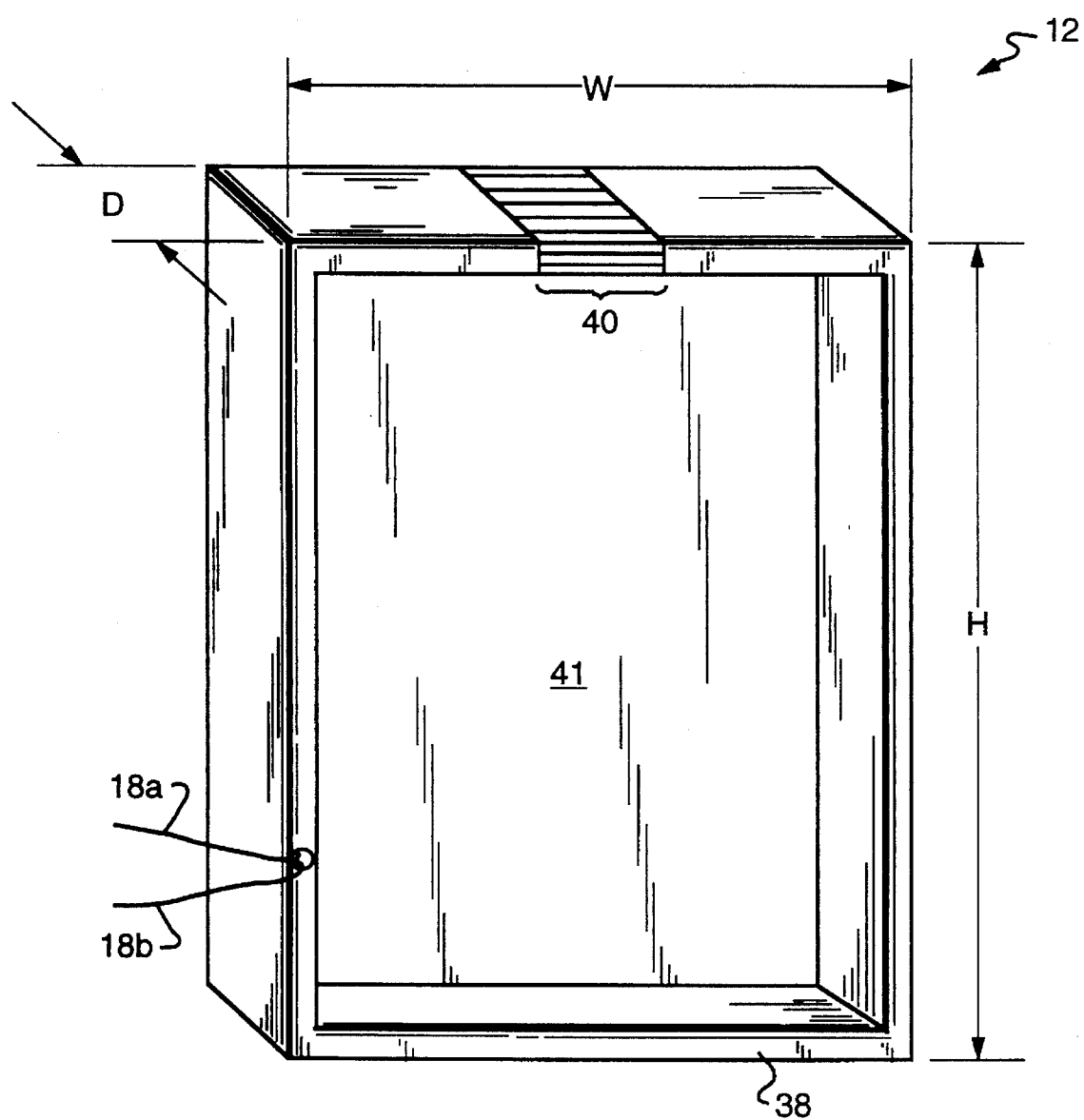
FIG. 3 is an isometric view of a pickup coil for use with the invention.

Various components of the meter 10 will now be described in greater detail. FIG. 3 is an isometric view illustrating the coil 12. The coil 12 is preferably wound in a rectangular shape from approximately 250 turns of Number 34 wire. The wire coil 12 is also wrapped with an appropriate conductive shield 38, such as thin copper tape, of approximately 0.003 inches thickness. The conductive shield 38 is fabricated to completely surround the coil 12, with the exception of a small gap section 40. The gap section 40 provides an interruption for cross currents which might otherwise appear on the shield 38 itself. This effect has been found appreciable enough to reduce the accuracy of measurements taken in the VLF band, in particular. The shielded coil 12 is thus fairly immune to electrostatic induction fields generated by the proximity of the operator of the meter 10, such as may be caused by the capacitance of the user's hand interacting with the inductance presented by the coil.

The shield 38 also permits the filter/detector 14 to be disposed in the space 41 created within the center of the rectangularly wound coil 12, which maximizes convenience in packing the unit in as small a space as possible.

The finished diameter of the coil 12, including the thickness of the tape, must be controlled in order to insure proper detection of the electromagnetic fields of interest. A height dimension, H, of 2.65 inches, and a maximum outer width W, of 2.19 inches is preferred. The depth, D, of the coil 12 is not as critical, but is typically approximately 0.375 inches.

The finished inner dimensions of the coil are also not as critical to the operation of the device, and are typically 2.0 by 2.5 inches.

The leads 18a and 18b are preferably taken from a point on the side of the coil 12 and let out through the surrounding shield 38.

Figure 4A:
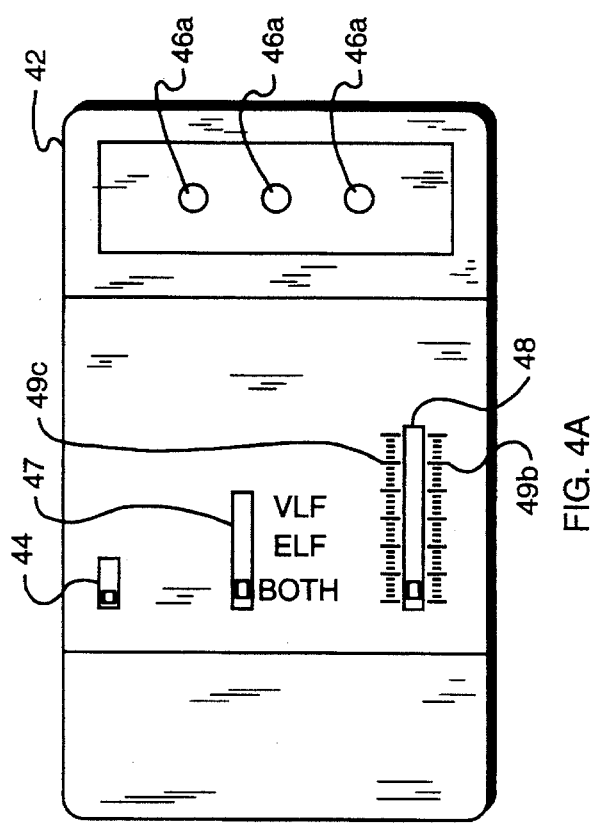
FIGS. 4A and 4B are top and side views, respectively, of an external case.
Figure 4B:
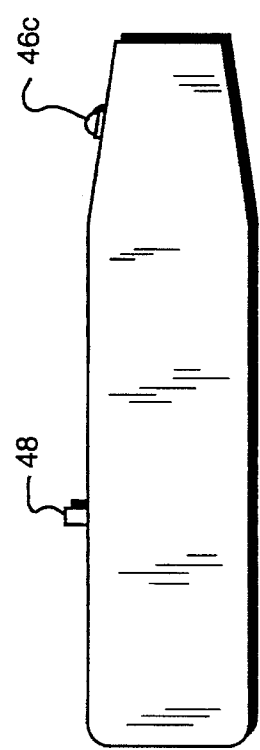

FIGS. 4A and 4B are top and side views, respectively, of the exterior of a case 42 which is used to package the components of the invention. The case 42 is a size which is convenient to be held in the hand, such as approximately 2.5 inches wide by 4 inches long. In the side view of FIG. 4B, the case 42 is seen to have a maximum dimension of approximately one inch. The coil 12 can thus be conveniently disposed within the inner dimensions of the case.

Disposed on the outside of the case 42 are an on/off switch 44, three light-emitting diodes (LEDs) including a green LED 46a, a yellow LED 46b, and a red LED 46c, a band selector switch 47 and potentiometer slide switch 48.

In operation, the user switches the meter 10 to an "ON" state via the on/off switch 44, and then determines the exposure to electromagnetic radiation by simply observing the indication of field strength as presented by the three LEDs 46. Because the electromagnetic fields of interest are typically directionally oriented, it is also typically necessary to rotate the case 42 through the three principal directional axes to determine peak field readings in any of the possible directions. This is easily accomplished by grasping by unit 42 in the hand, and then rotating the wrist and arm along the three principal directions.

The user may also select a band of interest by operating the middle three-position switch 47. In most cases, when not concerned with the exact magnitude of the field strength, but just whether the guidelines have been exceeded, the user will be interested in both energy bands. However, the switch 47 enables selection of either the VLF or ELF band output alone to be sent to the LEDs. In either of these single-band modes, the slide switch 48 and the adjacent scales 49a and 49b imprinted on the face of the unit 42 permit the user to determine the magnitude of the field in the particular band, as described below.

Figure 5:
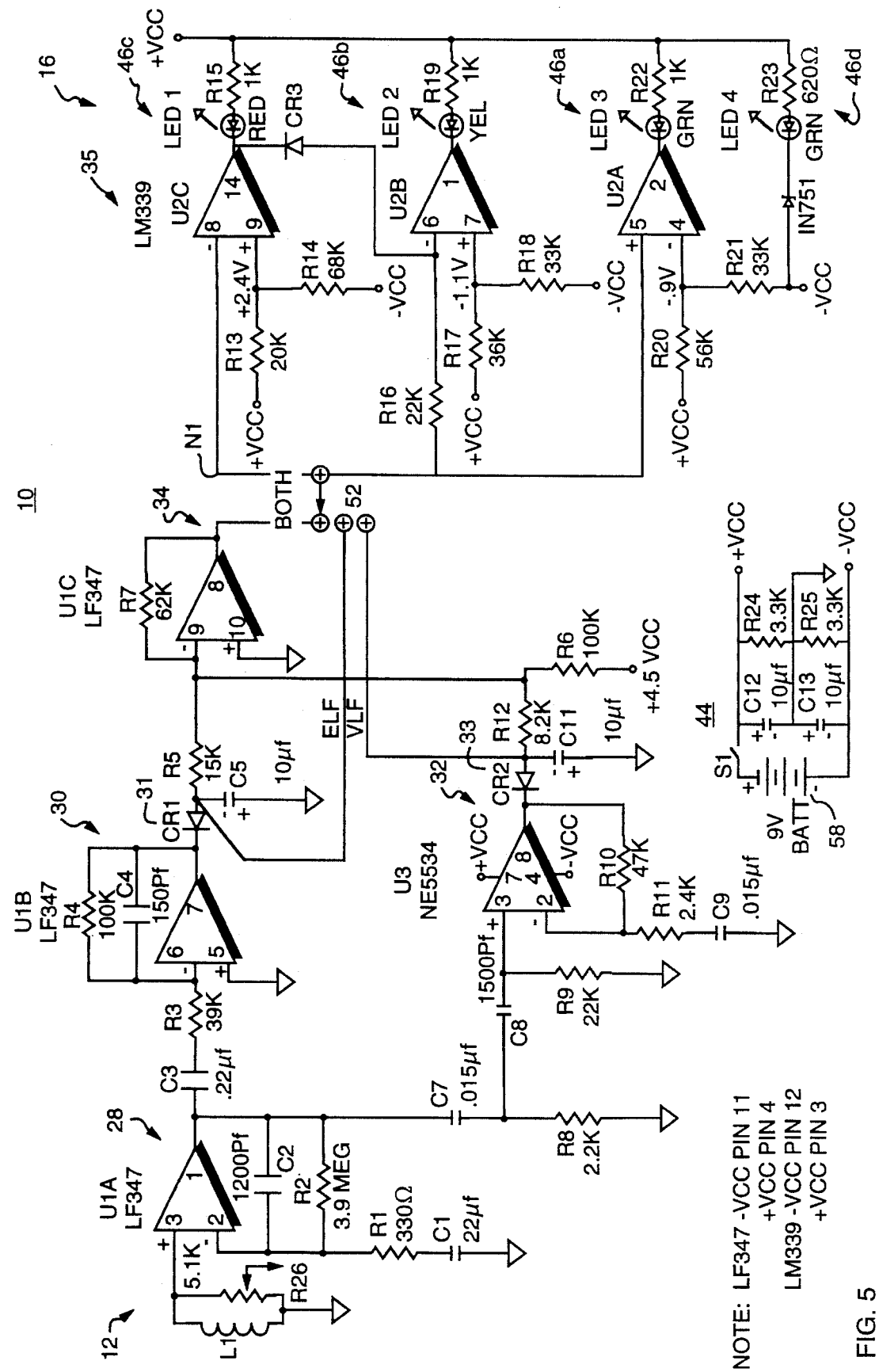
FIG. 5 is a detailed schematic level diagram of the circuitry used.

FIG. 5 is a detailed electrical schematic drawing of the preferred embodiment of the meter 10; other circuits which perform the analogous functions can be devised by those of skill in the art after reading this specification. Reference numerals have been superimposed on the drawing in FIG. 5 to indicate the various component parts which have already been discussed for the block diagram of FIG. 1.

The coil L1 (12) is shown connected to the equalizer preamplifier 28, which consists of a first operational amplifier (op amp) component U1A known as an LF 347, and input biasing resistance R26, and gain control components including a first capacitor C1 connected in series with a first resistor R1, a feedback resistor R2, and feedback capacitor C2. These gain control components are necessary in order to equalize the frequency-proportional sensitivity of the coil 12 within the ELF range, from approximately 30 Hertz (Hz) to approximately 400 kHz.

The input biasing resistance 26 may also be embodied as a potentiometer controlled by the slide switch 48. When the potentiometer is in the lowest resistance position, it provides an impedance of 5.1K ohms, which causes the rest of the circuit 10 to operate to detect whether the received radiation is within the guidelines set by the Swedish government as described above. When the slide switch 48 provides some higher impedance, it is used, together with the scales 49a and 49b to estimate field strength, as described below.

The impedance values of the other components are selected by taking into consideration the fact that the above described coil has been found to provide approximately 250 microvolts peak to peak in a 2.5 miligauss, 60 Hz electromagnetic field. This translates to a desired voltage gain in the range of 400,00/f, where "f" is in hertz.

The illustrated ELF filter 30 is designed to effect a transfer function having a lower 3 db (half-power) cutoff frequency of approximately 12 Hz, and an upper cutoff at 2 kHz, with a peak response occurring near 100 Hz. The illustrated higher band, VLF filter 32 is designed to have an effective lower 3 db cutoff at 6 kHz, and approximately 100 kHz at the high end. However, these cut off frequencies need not be observed exactly, for example, the ELF filter 30 lower cutoff may be at 5 Hz, and the upper cutoff for the VLF filter 32 may be at 120 kHz.

A root-mean-square (RMS) estimate of the energy level at the output of the ELF and VLF filters 30 and 32 is provided by detectors 31 and 33, respectively. For the ELF filler 30, the transformation from peak to RMS is determined by the usual gain multiplication by the square root of two, or 0.707 times a peak value measurement. However, for the VLF filter 32, the aforementioned "Alternating Electromagnetic Field Exposure Guidelines", MPR 1990-8 has determined a suitable relationship to be that RMS equals 0.65 times a peak detected value. These relationships were used to determine the impedance values of the components which control the gain of the operational amplifiers U1B and U3 that are used to implement the filters 30 and 32.

More particularly, the ELF filter circuit 30 includes an operational amplifier U1B, an input capacitor C3, input series resistor R3, feedback resistor R4, and feedback capacitor C4. The ELF detector 31 is implemented as a diode CR1 and shunt capacitor C5 connected to the output of the amplifier U1B. With a peak-to-peak 250 millivolt signal level at 30 hz provided by the coil L1, the op amp U1B provides a two volt peak-to-peak signal to the detector diode CR1. Allowing for a 0.7 voltage drop in the detector diode CR1 and shunt capacitor C5, an approximately −1.3 volt direct current (DC) level is thus provided to the 15 k ohm series resistor R5 to drive the summing amplifier U1C.

The VLF filter 32 includes another op amp U3, input capacitors C7 and C8, input shunt resistors R8 and R9, feedback resistors R10 and R11, and shunt capacitors C9. The impedance values of these components are selected to provide a gain of approximately 20, so that a threshold-level VLF signal output by the preamplifier 28 provides a 1.76 volt peak-to-peak signal at the input of detector CR2. Allowing for a 0.7 volt diode across the detector diode CR2, an approximately 1.06 volt DC signal is thus provided into the summing resistors R6 and R12 connected to the summing amplifier U1C.

The summing amplifier U1C and feedback resistor R7 are chosen to have a linear range of approximately plus or minus 3.5 volts. With no input signals present, the signal level at node N1 is approximately −2.8 volts DC.

If desired, a three position switch 52 (47 in FIG. 4A) may be disposed at the input N1 to the LEDs, to enable the user to select whether the ELF filter output, VLF filter output, or summed output at node N1 is presented to the display.

The battery 58 is a 9 volt battery and is used to supply power to the meter 10 through the switch 44. A capacitor and resistor network including C12, C13, R24 and R25 provide plus 4.5 and minus 4.5 volt power signals as +VCC and −VCC to provide power to the components. Power connections are made as shown—for the LF 347, the −VCC signal is connected to pin 11 and the +VCC signal to pin 4. For the LM 339, the −VCC signal is connected to pin 12 and the +VCC signal to pin 3. The LF 347 and LM 339 are manufactured by National Semiconductor of Santa Clara, Calif., and the NE 5534 by Nippon Electronic Corporation (NEC) of Japan.

The remaining three op amps, U2A, U2B and U2C control the display 16. The resistors R20 and R21 are selected to provide a reference voltage input to op amp U2A which causes the first comparator U2A to turn on the green LED 46a for DC voltage:, at node N1 less than −1.1 volts. Resistors R16, R17 and R18 are selected so that comparator amplifier U2A activates the yellow LED 46b for node N1 voltages between approximately −1.1 volts and 2.5 volts. The resistors R13 and R14 associated with third comparator U2C are selected to enable the red LED 46c at a node N1 voltage of approximately 2.5 volts, which corresponds to the threshold permissible electromagnetic field level.

The resistor R16 and the diode CR3 further serve to disable the yellow LED 46b when the red LED 46c is enabled. This provides an indication of the exact threshold point to the user.

The diode 1N751 and a fourth LED 46d (not shown in FIG. 4A) may be used to provide an indication that the battery within the unit is operational.

Resistors R15, R19, R22, and R23 serve as pull-up devices to activate the LEDs. The display 16 thus provides an easy to interpret indication of the relative severity of the ambient electromagnetic field.

For example, when the meter 10 is activated and placed right up against the screen of a CRT screen, the red LED 46c will usually be activated. As the meter 10 is moved away from the CRT screen, the yellow LED 46b will eventually be activated. By observing the difference between the position where the yellow LED 46b is activated and where the red LED 46c is turned off completely, the user may locate the minimum acceptable distance, for example, within which to sit in front of the CRT screen.

The slide switch 48 and scales 49a and 49b may be used together with the LEDs to determine an approximate field strength for each of the bands. For example, if the three position switch 47 is selected to connect just the ELF filter output, the slide 48 can be operated back and forth, thereby adjusting the resistance of the potentiometer R26, which in turn changes the threshold point of the red LED 46c. With the scale 49a appropriately calibrated, the user operates the slide 48 until the red LED 46c has just been activated; the position of the slide 48 as read against the ELF scale then provides an estimate of the field strength for the ELF band. The magnitude of the VLF field strength can similarly be determined by selecting the VLF position and reading the VLF scale 49b.

The terms and expressions which have been employed herein are used as terms of description and not of limitation, and there is no intention, in the use of such terms and expressions, of excluding any equivalents of the features shown and described or portions thereof, and it is recognized that various modifications are possible within the scope of the invention claimed.

What is claimed is:

1. A meter for measuring electromagnetic fields comprising:

a coil that produces a coil voltage in response to varying electromagnetic fields;

a first filter for receiving the coil voltage at an input, the filter having an upper cut-off frequency less than a predetermined frequency and providing a first output signal that is indicative of received electromagnetic field strength at frequencies below the upper cut-off frequency, the filter including components that provide the first output signal within a predetermined signal range;

a second filter for receiving the coil voltage at its input, the filter having a lower cut-off frequency greater than the predetermined frequency and providing a second output signal that is indicative of a received electromagnetic field strength at frequencies above the lower cut-off frequency, the filter including components that provide the second output signal within the predetermined signal range;

combining means for combining the first and second output signals from the first and second filters to provide a combined filter output signal indicative of the received electromagnetic field strengths at frequencies below the upper cut-off frequency of the first filter, and at frequencies above the lower cut-off frequency of the second filter; and display means, responsive to the combined filter output signal from the combining means, for generating a visual indication when the magnitude of the combined output signal indicates that a predetermined level of electromagnetic field strength has been exceeded.

2. A meter as in claim 1 further including:

a first detector means, connected to receive the first output signal from the first filter, and coupled to provide the first output signal to the combining means in the form of a voltage indicative of the received electromagnetic field strength at frequencies below the upper cut-off frequency of the first filter.

3. A meter as in claim 1 further including:

a second detector means, connected to receive the second output signal from the second filter, and coupled to provide the second output signal to the combining means in the form of a voltage indicative of the received electromagnetic field strength at frequencies above the lower cut-off frequency of the second filter.

4. A meter as in claim 1 wherein the display means comprises:

first, second, and third visual indicators, each of which is either activated or deactivated;

means for activating the first visual indicator when the combined filter output signal indicates that the received electromagnetic field strength is below the predetermined level;

means for activating the second visual indication when the combined filter output signal indicates that the received electromagnetic field strength is nearing the predetermined level; and means for activating the third visual indicator when the combined filter output signal indicates that the received electromagnetic field strength is above the predetermined level.

5. A meter as in claim 4 wherein the first, second and third indicators are of different colors.

6. A meter as in claim 5 wherein the first, second and third indicators are of a red, yellow, and green color, respectively.

7. A meter as in claim 4 wherein the first, second and third indicators are light emitting diodes.

8. A meter for measuring electromagnetic fields comprising:

an electromagnetic energy detecting means, for producing a signal in response to varying electromagnetic fields;

first signal generating means for receiving the signal from the energy detecting means and providing (a) a first output signal that is indicative of received electromagnetic field strength in a first frequency band and (b) a first detector signal that is indicative of whether a received electromagnetic field strength in the first frequency band exceeds a first predetermined threshold amount, the first detector signal being within a predetermined signal range;

second signal generating means for receiving the signal from the energy detecting means and providing (a) a second output signal that is indicative of received electromagnetic field strength in a second frequency band and (b) a second detector signal that is within the predetermined signal range and is indicative of whether a received electromagnetic field strength in the second frequency band exceeds a second predetermined threshold amount, the second predetermined threshold amount being different from the first predetermined threshold amount; and combining means for combining the first and the second output signals to produce a combined output signal;

third signal generating means for receiving the combined output signal and producing a third output signal that is indicative of whether received electromagnetic field strength in a combination of the first and second frequency bands exceeds a third predetermined threshold;

display means, responsive to the first and second detector signals and the third output signal, for generating a visual indication when the electromagnetic field strength in the first frequency band, second frequency band, or either or both bands exceeds the respective predetermined threshold amounts; and switch means including settings associated with a first mode, a second mode and a combination mode, the switch controlling the display means such that when the switch is in the setting associated with the first mode the display means responds to the first detector signal, when the switch is in the setting associated with the second mode the display means responds to the second detector signal and when the switch is in the setting associated with the third mode the display means responds to the third output signal.

9. A meter as in claim 8 wherein the electromagnetic energy detecting means is a coil.

10. A meter as in claim 8 wherein the electromagnetic energy detecting means is a coil of wire wound in a rectangular shape.

11. A meter as in claim 8 wherein the electromagnetic energy detecting means is a coil of wire wrapped with a conductive shield.

12. A meter as in claim 8 wherein the first frequency band is an extremely low frequency (ELF) band.

13. A meter as in claim 8 wherein the first frequency band is a very low frequency (VLF) band.

14. A meter as in claim 8 wherein the first signal generating means comprises a bandpass filter having a lower half-power cutoff frequency of about 12 Hertz (Hz), and an upper half-power cutoff frequency of about 2 kilohertz (kHz).

15. A meter as in claim 8 wherein the second signal generating means comprises a bandpass filter having a lower half-power cutoff frequency of about 6 kilohertz (kHz), and an upper half-power cutoff frequency of about 100 kilohertz (kHz).

16. A meter as in claim 8 wherein the first predetermined threshold amount is 250 nanoteslas.

17. A meter as in claim 8 wherein the second predetermined threshold amount is 25 nanoteslas.

18. A meter for determining whether low-frequency electromagnetic field strengths exceed predetermined acceptable levels, the meter comprising:

a coil that produces a coil voltage in response to varying electromagnetic fields;

an isolating amplifier for receiving the coil voltage, and providing an isolated coil output signal;

a first bandpass amplifier for receiving the isolated coil output signal, the first bandpass amplifier having a transfer function which covers an Extremely Low Frequency (ELF) band, the amplifier providing a first bandpass signal within a predetermined signal range;

a first detector diode for receiving the first bandpass signal, and providing a detector output signal indicative of the received electromagnetic field strength in the ELF band;

a second bandpass amplifier for receiving the isolated coil output signal, the second bandpass amplifier having a transfer function which covers a Very Low Frequency (VLF) band, the amplifier providing a second bandpass signal within the predetermined signal range;

a second detector diode for receiving the second bandpass signal and providing a detector output signal indicative of the received electromagnetic field strength in the VLF band;

a summing amplifier, for receiving the first and second detector signals and providing a combined output signal indicative of the received electromagnetic field strength in both the ELF and VLF bands;

three comparators, each receiving the combined output signal, and the first comparator being arranged to provide a first light emitting diode (LED) driver signal, the first LED driver signal being activated when the combined output signal indicates that the received electromagnetic field strength in the ELF and VLF bands is within a predetermined range;

the second comparator being arranged to provide a second light emitting diode (LED) driver signal, the second LED driver signal being activated when the combined output signal indicates that the received electromagnetic field strength in the ELF and VLF bands is near an upper end of the predetermined range; and the third comparator being arranged to provide a third light emitting diode (LED) driver signal, the third LED driver signal being activated when the combined output signal indicates that the received electromagnetic field strength in the ELF and VLF bands is above the predetermined range; and first, second and third diodes for receiving, respectively, the first, second and third LED driver signal.

19. A meter as in claim 18 further including means for deactivating the first LED driver signal when the combined output signal indicates that the received electromagnetic field strength is near the upper end or exceeds the upper end of the predetermined range.

20. A meter as in claim 18 wherein the second LED driver signal and the third LED driver signal are activated when the received electromagnetic field strength is at a predetermined level.

* * * * *